United States Patent [19]
Larson

[11] Patent Number: 6,044,550
[45] Date of Patent: *Apr. 4, 2000

[54] PROCESS FOR THE MANUFACTURE OF PRINTED CIRCUIT BOARDS

[75] Inventor: Gary B. Larson, Cheshire, Conn.

[73] Assignee: MacDermid, Incorporated, Waterbury, Conn.

[*] Notice: This patent issued on a continued prosecution application filed under 37 CFR 1.53(d), and is subject to the twenty year patent term provisions of 35 U.S.C. 154(a)(2).

[21] Appl. No.: 08/717,770

[22] Filed: Sep. 23, 1996

[51] Int. Cl.[7] .................................................. H01K 3/10
[52] U.S. Cl. ............................................. 29/852; 427/97
[58] Field of Search ................................. 29/852; 427/97

[56] References Cited

U.S. PATENT DOCUMENTS

| | | |
|---|---|---|
| 3,269,861 | 8/1966 | Schneble . |
| 3,457,638 | 7/1969 | Johnson . |
| 3,855,692 | 12/1974 | Dugan ........................................ 29/852 |
| 4,608,275 | 8/1986 | Kukanskis et al. . |
| 4,756,795 | 7/1988 | Bakos et al. ........................... 29/852 X |
| 4,863,758 | 9/1989 | Rhodenizer et al. . |
| 4,876,177 | 10/1989 | Akahoshi et al. . |
| 4,897,118 | 1/1990 | Ferrier et al. . |
| 4,931,148 | 6/1990 | Kukanskis et al. . |
| 4,976,990 | 12/1990 | Bach et al. . |
| 5,032,427 | 7/1991 | Kukanskis et al. . |
| 5,153,987 | 10/1992 | Takahashi et al. ........................ 29/852 |
| 5,160,579 | 11/1992 | Larson ................................. 427/97 X |
| 5,235,139 | 8/1993 | Bengston et al. . |
| 5,362,334 | 11/1994 | Adams et al. . |

FOREIGN PATENT DOCUMENTS

| | | |
|---|---|---|
| 1207631 | 10/1970 | United Kingdom . |
| 1259304 | 1/1972 | United Kingdom . |
| 9326145 | 12/1993 | WIPO . |

OTHER PUBLICATIONS

Anthony "Forming Electrical Interconnections Through Semiconductor Wafers" GE R&D Center New York, Aug. 1981 pp. 5340–5349 J. Appl. Physics.

*Primary Examiner*—Lee Young
*Assistant Examiner*—Rick Kiltae Chang
*Attorney, Agent, or Firm*—John L. Cordani

[57] ABSTRACT

The present invention relates to a process for the manufacture of printed circuit boards. The method contemplates a novel processing sequence for this manufacturing process which method is particularly versatile in reducing the number of steps and variety of chemicals currently necessary to produce the circuit boards.

12 Claims, 4 Drawing Sheets

PROCESS FOR THE MANUFACTURE OF PRINTED CIRCUIT BOARDS

FIELD OF THE INVENTION

The present invention relates to a process for the manufacture of double-sided and multi-layer printed circuit boards. The method proposed contemplates a specific manufacturing sequence and the use of electroless nickel for providing the necessary interconnections for building the circuitry to the desired thickness. The method is particularly versatile in reducing the number of steps and variety of chemicals currently necessary to produce these circuit boards.

BACKGROUND OF THE INVENTION

In the manufacture of printed circuit boards, it is now commonplace to produce printed circuitry on both sides of a planar rigid or flexible insulating substrate. The manufacture of multi-layer printed circuits which consist of parallel, planar, alternating inner layers of insulating substrate material and conductive metal is of increased importance. The exposed outer sides of the laminated structure are provided with circuit patterns, as with double-sided boards, and the inner layers themselves may contain circuit patterns.

In double-sided and multi-layer printed circuit boards, it is necessary to provide conductive interconnection between and among the various layers and/or sides. This is commonly achieved by providing copper plated through-holes. Copper is provided in various ways such as by electroless or electrolytic deposition or combinations thereof.

In terms of providing the desired circuit pattern on the board, the art has developed a variety of manufacturing sequences, many of which fall into the broad categories of subtractive or additive techniques. Common to the subtractive processes is the need to etch away (or subtract) metal to expose the desired circuit patterns. Additive processes, on the other hand, begin with clean dielectric substrate surfaces and build up thereon metallization in desired areas only, the desired areas being those not masked by a previously applied pattern of plating resist material. While avoiding the problems associated with the etching required in subtractive processes, additive processes have their own inherent difficulties in terms of the choice of resist materials, the ability to build up the full metallization thickness desired by electroless methods, the relatively long time periods required to electrolessly build the desired thickness' and weaknesses in the physical properties of most electroless copper, deposits.

U.S. Pat. No. 4,897,118 (Ferrier et. al), whose teachings are incorporated herein by reference, reveals a process for selective metallization of a substrate in a predetermined desired pattern (i.e. additive technology). Ferrier et. al. discussed additive technology, proposed certain improvements thereto, and give a fair picture of the current state-of-the-art in this area. The current invention proposes improvements thereto which provide significant advantages in reducing the number of steps and chemicals involved in the fabrication thereby making the fabrication process more economical and feasible.

The prior art additive processes suffered from a variety of problems. Firstly, most plating masks currently used in the industry are strippable in alkaline solutions. Electroless copper baths are invariably alkaline, usually very alkaline, with pH's in excess of 12. Therefore, known plating resists have great difficulty in maintaining their integrity and adhesion to the board surface when subjected to plating in electroless copper baths, particularly when the long plating periods required by these techniques (8 to 24 hours) are taken into consideration. When the plating mask loses its integrity and/or adhesion to the surface, circuit definition fails. As one possible solution to this problem see U.S. Pat. No. 4,876,177 (Akahoshi et al.), the teachings of which are incorporated herein by reference, where the organic resist undergoes its final curing after chemical copper plating.

Many alternate techniques have been developed to additively and semi-additively produce circuit boards. As one such technique, Kukanskis et al. (U.S. Pat. No. 4,931,148), the teachings of which are incorporated herein by reference, reveals a process whereby an organic resist is used to pattern the surface of the printed circuit. The entire surface is subsequently activated then the resist surfaces are deactivated by the application of an alkaline solution. Plating then occurs chemically in the desired pattern. A second alternative is proposed in PCT Patent Application No. 9326145 (Knopp), the teachings of which are incorporated herein by reference. Knopp reveals a process for the production of printed circuit boards whereby circuits are etched, holes are drilled, then a removable "desense" mask is applied. The printed circuit board is then activated, the "desense" mask removed, and then the holes and circuit features are plated. For additional alternative methods see British Patent No. 1,259,304 (Photocircuits Corporation) and British Patent No. 1,207,631 (Technograph Limited), the teachings of which are incorporated herein by reference.

The current application proposes a new method for semi-additively producing printed circuit boards. The process proposed improves upon prior methods in several ways including reduction of processing steps and ease of use.

SUMMARY OF THE INVENTION

Figure 1A:
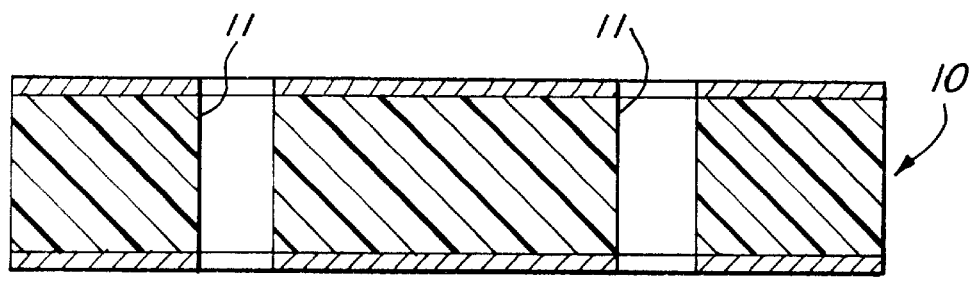
FIG. 1(a)—copper clad laminate (10) with holes (11) drilled.
Figure 1B:
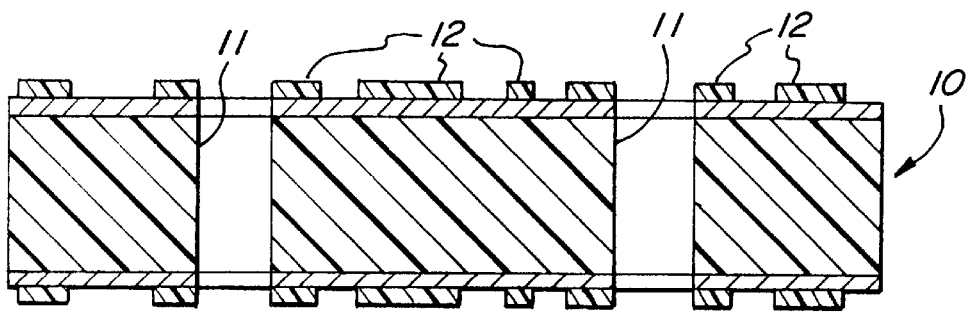
FIG. 1(b)—application of an imaged etch resist(12)
Figure 1C:
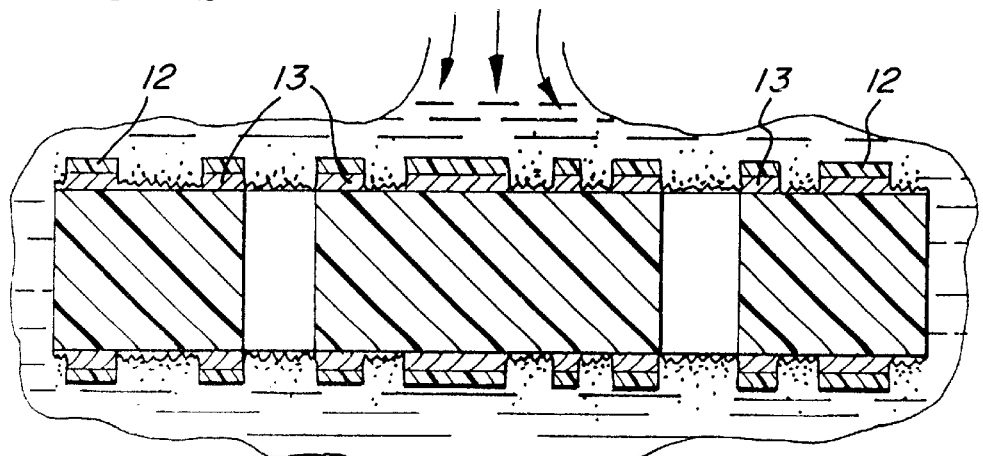
FIG. 1(c)—creation of circuit elements (13) via contact with a copper etchant.
Figure 1D:
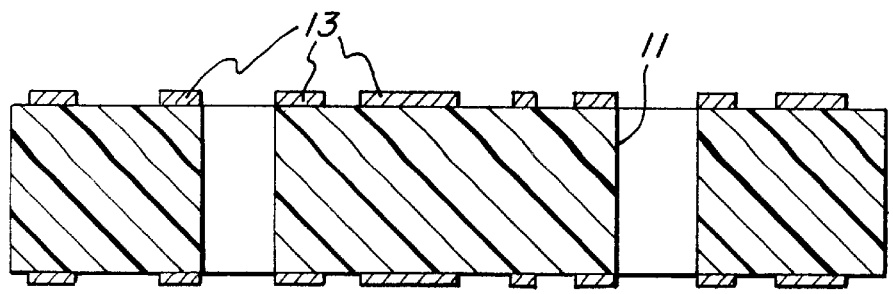
FIG. 1(d)—etch resist stripped away.
Figure 1E:
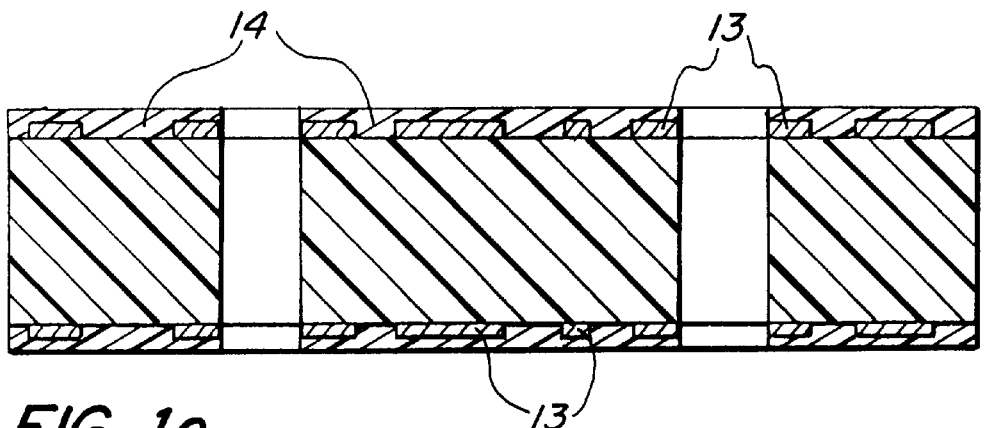
FIG. 1(e)—application of a plating mask(14)
Figure 1F:
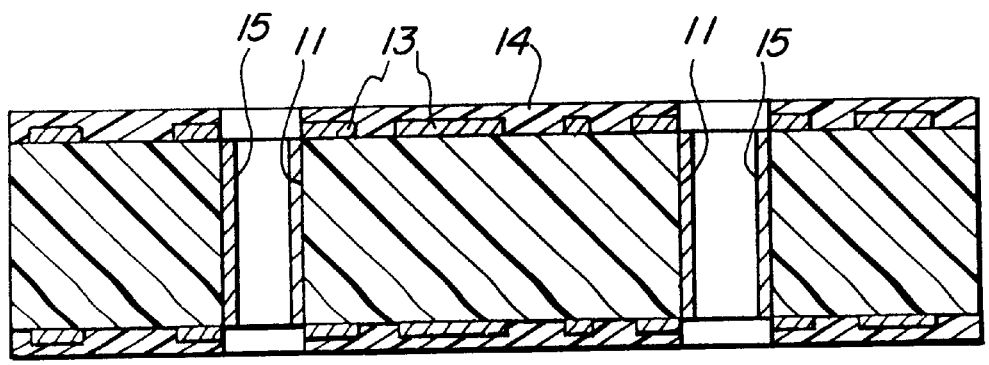
FIG. 1(f)—plating metal(15) coating in the holes(11).
Figure 2A:
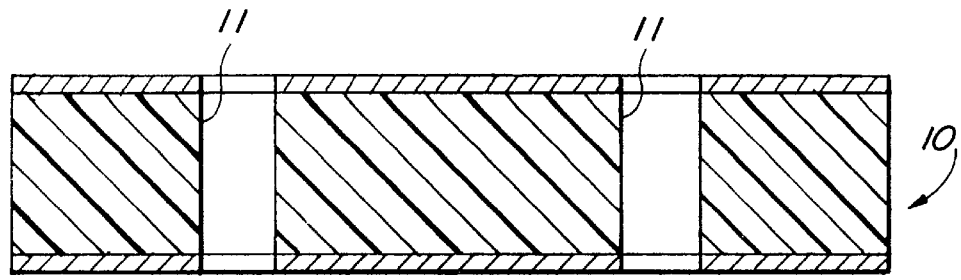
FIG. 2(a)—copper clad laminate (10) with holes (11) drilled.
Figure 2B:
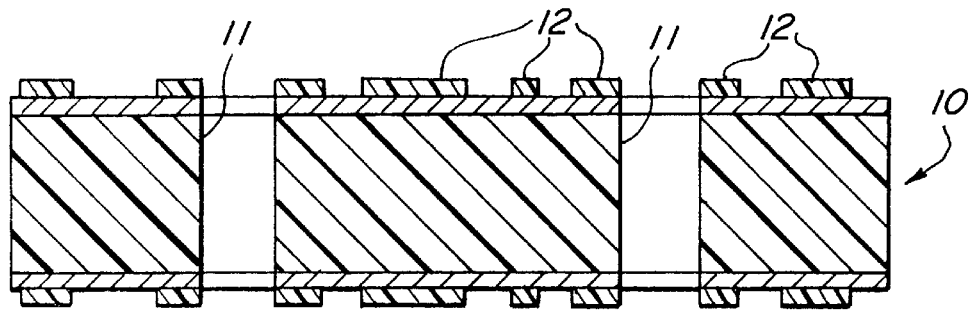
FIG. 2(b)—application of an imaged etch resist(12)
Figure 2C:
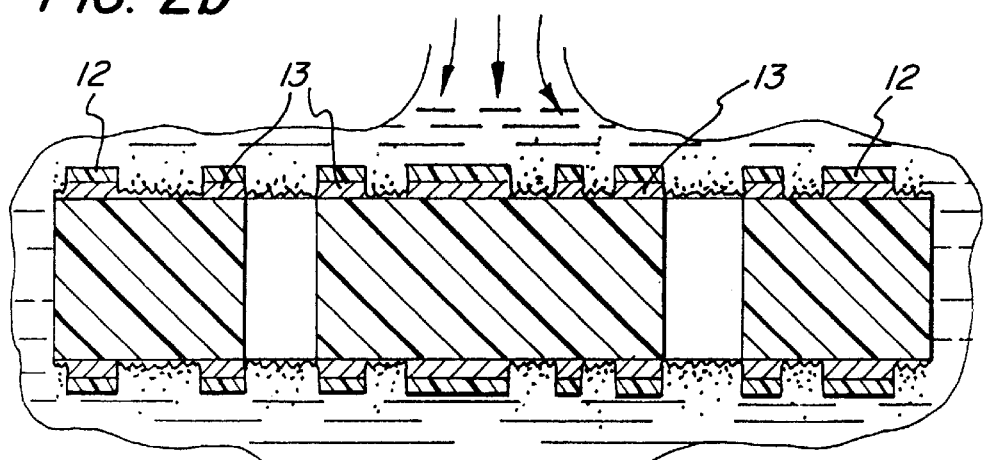
FIG. 2(c)—creation of circuit elements(13) via contact with a copper etchant.
Figure 2D:
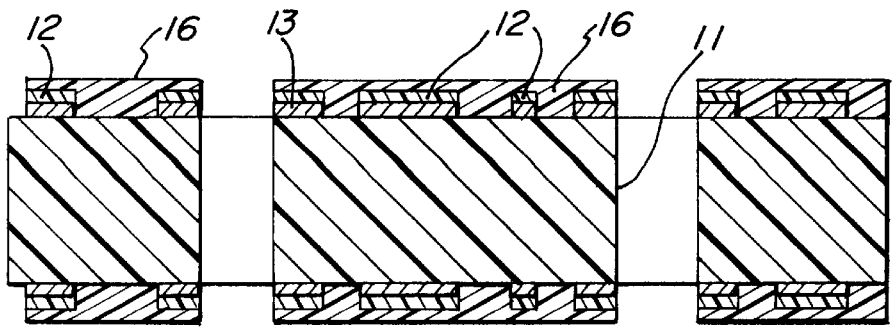
FIG. 2(d)—application of an imaged plating mask(16) over at least a portion of the etch resist.
Figure 2E:
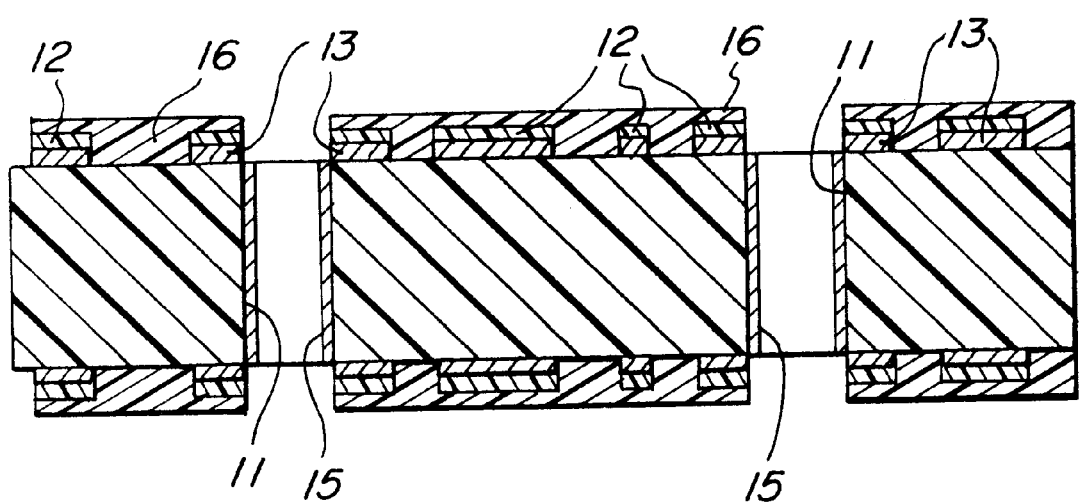
FIG. 2(e)—plating metal(15) in the holes(11).

The present invention proposes an improved process for the manufacture of printed circuit boards. The method provides various advantages over the prior art, including reduced number of cycle steps, reduced number and types of necessary chemical treatments and increased manufacturing efficiency. This method thus overcomes many difficulties experienced with prior methods, particularly by providing a workable process for the production of printed circuit boards without the need for electroplating.

The method currently proposed contemplates a specific manufacturing sequence for the production of printed circuit boards in combination with electroless plating for building circuitry to thickness. The most preferred form of electroless plating in this application is electroless nickel. The following basic production cycle is proposed for implementation of this invention:

1. Drill holes in desired array;
2. Optionally, deburr the holes;
3. Apply a Print and Etch Resist in the desired pattern;
4. Etch the exposed copper surfaces;
5. Activate holes; thereafter
6. Strip the Print and Etch Resist;
7. Apply Plating Mask;
8. Metal Plate; thereafter
9. Strip Plating Mask;
10. Optionally strip residual catalyst;
11. Optionally final finish.

Various optional steps may be added to this basic cycle to suit the particular needs of the fabricator. As used herein, and in the claims, copper clad laminate shall include multilayer circuitry packages as well as double sided circuitry packages.

DETAILED DESCRIPTION OF THE INVENTION

The present method is an improvement upon the semi-additive techniques for production of printed circuits. As such the invention addresses many of the concerns and problems experienced by past techniques through the use of a specific processing sequence. The present invention proposes the following basic cycle for the production of double-sided and multilayer printed circuit boards:

1. Drill holes in desired array;
2. Optionally, deburr the holes;
3. Create circuitry on outer surfaces of copper clad laminate or multilayer package;
4. Activate holes;
5. Optionally, strip print and etch resist applied in step (2);
6. Apply plating mask;
7. Metal plate;
8. Strip plating mask;
9. Optionally, strip residual catalyst;
10. Optionally, applying a final finish.

*Note: Copper clad laminate and multilayer package are used herein and in the claims interchangeably.

The first step calls for holes to be drilled or punched in the copper clad laminate. Thus holes will penetrate through the entire board. Vias may penetrate through one side of the board into the interior of the board but not through to the other side.

The second step is optional, but recommended, and involves deburring the holes. Deburring is typically a mechanical process whereby any burrs left on the holes from the drilling process are removed. The fact that the process of this invention does not utilize a "desense mask" as disclosed in Knopp, allows the advantageous flexibility of deburring at this point.

The third step calls for the formation of circuitry on the outer surfaces of the copper clad laminate. Typically this is accomplished by applying print and etch resist in an image-wise fashion to the outer surfaces of the copper clad laminate. Most notably, dry film resists are applied, exposed and developed to create a positive image of the desired circuitry on the outer surfaces. The exposed copper surfaces are then etched away causing the resist covered circuitry to stand out in vertical relief.

Next, the holes are activated to accept plating. Activation of the holes can range in complexity from a single dip in a previous metal activator (or other non-precious metal activates known in the art) to a full Desmear (or etch bath), plated through-hole cycle involving numerous steps. Optionally, if Desmear is desired, the Desmear portion of the activation cycle may be separated from the activation cycle and inserted between step 2 (optional deburr) and step 3 (creation of circuitry) of the overall process of this invention. Desmear generally consists of hole condition, dielectric etch, neutralization and optional glass etch. The most complex hole activation cycle might consist of hole condition (m-Pyrol), potassium permanganate desmear, neutralization (acid/reducer), glass etch (Ammonium Bifluoride), (the foregoing steps comprising Desmear) conditioner (surfactant or other type), microetch, activator ($PdCl_2/SnCl_2$Colloid) and accelerator. Clean water rinses are interposed between each chemical treatment. Various combinations will be apparent to those skilled in the art. Regardless of which hole activation cycle is chosen, its primary purpose is to treat the holes so that the hole surfaces will initiate plating. A wide variety of methods for achieving this are known in the art, any of which may be advantageously be utilized here. Please refer to U.S. Pat. Nos. 5,032,427 (Kukanskis et al.), U.S. Pat. No. 4,976,990 (Back et al.), U.S. Pat. No. 4,608,275 (Kukanskis et al.) and U.S. Pat. No. 4,863,758 (Rhodenizer), the teachings all of which are incorporated herein by reference in their entirety.

Next, the print and etch resist which was applied in the second step is stripped off the surfaces of the copper clad laminate. Typically an alkaline or solvent based solution is used to strip the resist. Preferably the stripping action does not affect the activation in the holes. In this regard a mildly alkaline stripping solution is advantageous. In another embodiment of this invention the print and etch resist is not stripped at this point but is left in place on the board and stripped later in the process in the same step where the plating mask is stripped.

At this point, the outer surfaces of the double-sided or multilayer circuitry are coated with a plating mask. The plating mask can be applied in several ways including dry film lamination, roller coating, curtin coating, screening, or various similar techniques. The most important aspect here is for the plating mask to cover all surfaces which are not to be plated. It must be particularly noted that since the print and etch resist was exposed to activation, the print and etch resist must either be stripped or covered with the plating mask to avoid plating on such resist. Generally the plating mask is imaged so that the areas to be subsequently plated are not covered and the plating mask covers all other areas of the surface. The plating mask can be imaged in various ways including screening, photoimaging followed by development, or similar techniques. Finally the plating mask is cured either by application of heat, photoradiation or both. Compositions and methods of application of plating masks are well known in the art. It has been found most advantageous to apply the plating mask such that it covers substantially all of the exterior areas of the board except for the holes. This allows for plating in the holes only, and thus reduces the amount of plating chemicals required.

Heretofore prior art had taught the necessity of plating the holes as well as the surface features of printed circuit boards. Note that if any print and etch resist is showing after application of the plating mask it may easily be removed at this point, particularly if the print and etch resist chosen has different solubility or stripping characteristics than the plating mask.

After this it is optionally advantageous to clean the exposed copper surfaces, particularly exposed copper surfaces in and around the holes. This is advantageously performed with typical alkaline or acid based cleaning compositions widely used in the industry. Preferably the cleaning operation will not affect the activation in the holes.

The next step is to initiate plating in the holes and possibly upon the areas of connection and/or circuits (depending upon the image of the plating mask). This initiation can occur in several ways. One preferred example is through the application of electroless copper. Another is through the application of electroless nickel.

Either of these solutions will initiate plating upon the activated areas only. Thus, only the holes and other areas not covered by the plating mask will be plated. It has been discovered that initiation of plating can be made directly through the use of electroless nickel phosphorous in this case. This is possible because the surface features have been etched on the surface prior to this stage. If electroless nickel-phosphorous is used it is preferable to continue to build the entire required thickness with the electroless nickel-phosphorous solution. It is most advantageous to utilize a "high phosphorous" nickel-phosphorous bath which deposits nickel with 10% or greater phosphorous content.

The next step could be a continuation of the previous step, or, it could be a separate step as indicated on the former sequence. The object of this step is to plate the holes and other uncovered areas to the appropriate metal thickness. Thus, if an appropriate electroless copper is used in the previous step, the board could be left in the electroless copper for an extended time to build the appropriate thickness of copper. One preferred method, however is to initiate plating in the previous step with electroless copper (10 to 150 microinches of copper) and then to follow that initiation with either electroless nickel phosphorous preferably, (with prior activation of the copper) or a strike of electroless nickel-boron followed by electroless nickel-phosphorous. It is more preferable, however to accomplish all of the plating in a single electroless nickel, preferably electroless nickel-phosphorous, plating step.

After metalization of the desired surfaces the plating mask can now be stripped away. In addition, if the print and etch resist was not previously stripped it should now be stripped along with the plating mask. Typically an alkaline or solvent based solution will be used to strip the resist and the mask.

The next step is to, optionally, remove any residual catalyst from the surfaces of the board. This step may be desired, depending upon the activation cycle used, in order to improve or restore the surface insulation resistance of the board. Typical methods of performing these optional operations are described in U.S. Pat. Nos. 5,221,418; 5,207,867; and 4,978,422, the teachings each of which are incorporated herein by reference.

The final step is optional, but recommended. This step consists of applying some form of final finish to the holes and other areas of connection. These final finishes have as their objective, the protection and/or enhancement of the solderability of these surfaces. A final finish may take one of many forms. It may consist of an organic treatment which preserves and enhances the solderability of these surfaces, such as is described in U.S. Pat. No. 5,362,334 (Adams et al.) the teachings of which are incorporated herein by reference in their entirety. Alternatively or in addition, it may consist of a series of metallic treatments, possibly culminating in a precious metal coating as described in U.S. Pat. Nos. 5,235,139, the teachings of which are incorporated herein by reference in their entirety.

The final finish step (9) can consist of any one of several variations, including the following:

Option 1

9(a) Plate final finish metal coating or coatings (typically palladium, copper or gold over nickel) onto all surfaces not covered by the plating mask.

9(b) Strip plating mask.

9(c) Apply organic Solderability Preservative (as described above)

Option 2

9(a) Strip plating mask.

9(b) Apply Solder Mask to selected areas of the surfaces of the copper clad laminate, typically all areas other than areas of connection (ie. holes, pads, lands etc.)

9(c) Hot Air Solder Level.

Option 3

9(a) Strip plating mask

9(b) Apply Solder Mask as in option 2

9(c) Apply final finish metal coating or coatings (typically Palladium, Copper or Gold over Nickel) onto all surfaces not covered by the Solder Mask.

Option 4

9(a) Strip plating mask

9(b) Apply Solder Mask as in option 2

9(c) Apply Organic Solderability Preservative.

Typical solder masks and processes for their use are described in U.S. Pat. No. 5,296,334, the teachings of which are incorporated by reference herein in their entirety. One typical final finish is described in U.S. Pat. No. 5,235,139, the teachings of which are incorporated herein by reference in their entirety. One typical organic solderability preservative is described in U.S. Pat. No. 5,362,334 the teachings of which are incorporated herein by reference in their entirety. Various additional steps may be inserted between the steps of the proposed process sequence. In addition, substitutions may also be made. These insertions or substitutions may be such as would be obvious to one skilled in the art. In addition please note that it is recommended that fresh water rinses be included between chemical treatment steps unless specifically noted otherwise.

This invention is further described in the following examples which are given for illustrative purposes only, and are in no way limiting.

EXAMPLE 1

A printed circuit board was fabricated in the following manner according to the teachings of this invention:

1. Holes were drilled in a desired array.

2. A dry film print and etch resist was laminated onto both surfaces of a sized piece of copper clad laminate (board). The film was then exposed to U.V. radiation in an imagewise manner. The unexposed areas of the resist were then developed off the surfaces using a solution of 1% potassium carbonate. The copper clad laminate was then subjected to an ammoniacal copper etchant, thereby etching away the exposed copper and causing the circuits and other desired surface features to stand out in vertical relief.

3. The holes were activated to accept and initiate plating on their surface by subjecting the boards to the following treatments:

a. Cleaner/conditioner (MacDermid 9420) for 4 minutes at 110° F. by immersion therein.
b. Activation (MacDermid Mactivate 10) for 4 minutes at 110° F. by immersion therein.
* Rinsing is provided between steps.
4. The print and etch resist applied in step (2) above was then stripped in a 10% caustic solution.
5. MacuMask 9251 plating mask was then screened onto the surfaces of the board in an imagewise manner, then cured by baking at 320° F. for 15 minutes.
6. The exposed copper surfaces were cleaned in MacDermid 9271 cleaner at 115° F. for 4 minutes.
7. The holes and other exposed copper areas, were plated using MacDermid 101 high phosphorous electroless nickel plating solution to a thickness of approximately 1.0 mil.
8. A final finish was applied using the following process sequence:
    a. Electroless gold was then plated in the holes and any other exposed nickel surface.
    b. The plating mask was stripped using stripper 10067 solution at 95° F. for 4 minutes.
    c. A photoimageable solder mask was applied. (MacDermid MacuMask 6000).
Note: Fresh water rinses were interposed between chemical treatment steps.

EXAMPLE II

A printed circuit board was fabricated in the same manner as in Example 1, except that after Step 7 was replaced by the following:
a. The plating was initiated by immersing the boards in MacDermid Electroless nickel-boron for three minutes at 115° F. to plate approximately one to three microinches of nickel-boron. b. The boards were then immersed in MacDermid high phosphorous electroless nickel for 120 minutes at 190° F. to plate approximately 1.0 mil of nickel-phosphorous.

EXAMPLE III

A printed circuit board was fabricated in the same manner as in Example I, except that the board was a multilayer printed circuit board and therefore the board was subjected to the following treatments directly before step 3(a):
a). Solvent Swell-(MacDermid 9204)-, 2 minutes, 100° F.
b). Potassium Permanganate (MacDermid 9275), 60 gr/L, 10 minutes, 160° F.
c). Neutralizer (MacDermid 9279), 110° F., 5 minutes
*Note. Fresh water rinses are interposed between each chemical treatment step.

EXAMPLE IV

A printed circuit board was fabricated in the same manner as in Example I, except that Step 8 was as follows:
8(a) Stripped plating mask in stripper 10067 solution at 95° F. for 4 minutes.
8(b) Applied Photoimageable Soldermask (MacDermid MacuMask 6000)
8(c) Plated Electroless Gold using MacDermid Planar Electroless Gold onto all surfaces not covered by the Solder Mask.

EXAMPLE V

A printed circuit board was fabricated in the same manner as in Example 1, except that step 8 was as follows:

8(a.) Electroless copper was then plated in the holes and on any other exposed nickel surface using MacDermid 9048 Electroless Copper
8(b.) The plating mask was stripped using MacDermid Stripper 10067
8(c.) A photoimageable solder mask was applied. (MacDermid MacuMask 6000)
8(d.) Applied organic solderability protectant to the final surface of the printed circuit board using MacDermid M-Coat+.

EXAMPLE VI

A printed circuit board was fabricated in the same way as Example I, except that step 4 was eliminated and the print and etch resist was stripped off in step 8(b) along with the plating mask.

The printed circuit boards in all the above examples were tested in a variety of ways including standard solder shock tests, conductivity tests, cross section tests, and various functional testing. The results of all testing revealed that all of the printed circuit boards produced, functioned acceptably, for the purposes intended.

As can be seen from the current specification, the proposed process has many advantages over the prior art processes. One of the most important advantages is that it provides an efficient method of producing printed circuit boards which substantially reduces the number of required steps and processes required. In addition, the proposed process provides a workable semi-additive approach to producing printed circuit boards.

What is claimed is:
1. A process for producing printed circuit boards, which process comprises the following steps:
    a. drilling holes in a copper clad laminate;
    b. applying an imaged etch resist to at least one outer surface of the copper clad laminate;
    c. contacting the copper clad laminate with an etchant for copper, thereby creating circuit elements on the at least one outer surface of the copper clad laminate having the imaged etch resist applied thereon;
    d. activating said holes to accept plating therein;
    e. stripping away said imaged etch resist;
    f. applying an imaged plating mask to the at least one outer surface of the copper clad laminate;
    g. contacting the copper clad laminate with a plating solution which plates a metal coating in said holes.
wherein the foregoing steps are performed in the order given relative to each other.
2. The process according to claim 1 wherein the plating solution is a high phosphorous electroless nickel plating solution.
3. The process according to claim 1, wherein the plating solution is a nickel-boron plating solution and wherein after step (g) removing the plating mask and contacting the copper clad laminate with a second plating solution which second plating solution is a high phosphorous electroless nickel plating solution.
4. The process according to claim 1 wherein the plating solution is an electroless copper plating solution and wherein after step (g) further comprising a step of contacting the copper clad laminate with a second plating solution which second plating solution is a high phosphorous electroless nickel plating solution.
5. The process according to claim 1 wherein after step (g), further comprising a step of contacting the copper clad with a second plating solution which second plating solution produces a second metal coating with a metal selected from the group consisting of palladium, copper and gold, and wherein thereafter removing the plating mask and contacting the copper clad laminate with an organic solderability preservative.

6. A process according to claim 1 wherein after step (g), removing the plating mask and thereafter contacting the copper clad laminate with a composition selected from the group comprising an electroless palladium plating solution, an electroless copper plating solution, an electroless gold plating solution and an organic solderability preservative.

7. The process according to claim 1 wherein covering substantially all of the copper clad laminate except for the holes with the plating mask.

8. The process according to claim 1 wherein deburring the holes between step (a) and step (b).

9. The process according to claim 1 wherein desmearing the holes between step (a) and step (b).

10. A process for producing printed circuit boards, which process comprises the following steps:

a. drilling holes in a copper clad laminate;

b. applying an imaged etch resist to at least one outer surface of the copper clad laminate;

c. contacting the copper clad laminate with an etchant for copper, thereby creating circuit elements on the at least one outer surface of the copper clad laminate having the imaged etch resist applied thereon;

d. activating said holes to accept plating therein;

e. applying an imaged plating mask to the at least one outer surface of the copper clad laminate such that the imaged plating mask covers at least a portion of the imaged etch resist;

f. contacting the copper clad laminate with a plating solution which plates a metal coating in said holes;

wherein the foregoing steps are performed in the order given relative to each other;

g. stripping plate mask.

11. A process according to claim 10 wherein deburring the holes between step (a) and step (b).

12. The process according to claim 10 wherein desmearing the holes between step (a) and step (b).

* * * * *